(12) United States Patent
Park (10) Patent No.: US 12,154,796 B2
(45) Date of Patent: Nov. 26, 2024

(54) METHOD FOR TREATING SUBSTRATE

(71) Applicant: SEMES CO., LTD., Chungcheongnam-do (KR)

(72) Inventor: Joo Jib Park, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/579,303

(22) Filed: Jan. 19, 2022

(65) Prior Publication Data

US 2022/0139731 A1 May 5, 2022

Related U.S. Application Data

(62) Division of application No. 16/717,931, filed on Dec. 17, 2019, now abandoned.

(30) Foreign Application Priority Data

Dec. 18, 2018 (KR) .................... 10-2018-0163690

(51) Int. Cl.
*H01L 21/02* (2006.01)
*B08B 3/08* (2006.01)
(Continued)

(52) U.S. Cl.
CPC .......... *H01L 21/67034* (2013.01); *B08B 3/08* (2013.01); *B08B 3/106* (2013.01);
(Continued)

(58) Field of Classification Search
CPC ......... H01L 21/02101; H01L 21/02041; H01L 21/02052; H01L 21/02054;
(Continued)

(56) References Cited

U.S. PATENT DOCUMENTS

| 6,483,081 B1 | 11/2002 | Batchelder |
| 2004/0182416 A1* | 9/2004 | Allen .................... B08B 7/0035 134/1 |

(Continued)

FOREIGN PATENT DOCUMENTS

| CN | 104919574 A | 9/2015 |
| JP | H07-211681 A | 8/1995 |

(Continued)

OTHER PUBLICATIONS

Notice of References Cited for Priority U.S. Appl. No. 16/717,931 mailed on Oct. 18, 2021 (1 page).

(Continued)

*Primary Examiner* — Natasha N Campbell
*Assistant Examiner* — Richard Z. Zhang
(74) *Attorney, Agent, or Firm* — PROCOPIO, CORY, HARGREAVES & SAVITCH LLP (57) ABSTRACT

A method for treating a substrate, including a solvent processing step of supplying an organic solvent onto the substrate to treat the substrate, a drying step of drying the substrate to remove the organic solvent on the substrate, and a bake step of heating the substrate to thermally decompose an impurity adhering to the substrate, where the drying step and the bake step are performed in different chambers.

11 Claims, 8 Drawing Sheets

(51) Int. Cl.
  *B08B 3/10* (2006.01)
  *F26B 5/00* (2006.01)
  *H01L 21/67* (2006.01)
(52) U.S. Cl.
  CPC ........ *F26B 5/005* (2013.01); *H01L 21/02101* (2013.01); *H01L 21/67098* (2013.01); *H01L 21/67115* (2013.01)
(58) Field of Classification Search
  CPC ......... H01L 21/02057; H01L 21/02345; H01L 21/02348; H01L 21/67098; H01L 21/67115; H01L 21/67034; H01L 21/67028; H01L 21/67023; H01L 21/67017; H01L 21/677–6796; H01L 21/00–86; B08B 7/0035; B08B 7/005; B08B 7/0057
  See application file for complete search history.

(56) References Cited

U.S. PATENT DOCUMENTS

| | | | |
|---|---|---|---|
| 2004/0206375 | A1 | 10/2004 | Ho |
| 2006/0003570 | A1* | 1/2006 | Shanmugasundram ..................... H01L 21/02068 257/E21.174 |
| 2006/0011133 | A1* | 1/2006 | Nishibayashi .... H01L 21/67017 118/630 |
| 2007/0067117 | A1* | 3/2007 | Lim ................. H01L 21/67115 702/56 |
| 2007/0068920 | A1 | 3/2007 | Kang |
| 2009/0326703 | A1* | 12/2009 | Presley ............. H01L 21/67727 700/121 |
| 2012/0231397 | A1* | 9/2012 | Le Claire .......... H01L 21/67028 430/320 |
| 2013/0000144 | A1 | 1/2013 | Choi et al. |
| 2014/0144462 | A1 | 5/2014 | Verhaverbeke |
| 2014/0256128 | A1* | 9/2014 | Spurlin ............. H01L 21/67115 438/643 |
| 2015/0118012 | A1 | 4/2015 | Hawkins |
| 2016/0059277 | A1* | 3/2016 | Hong ................ H01L 21/67017 134/99.1 |
| 2017/0341106 | A1 | 11/2017 | Bang |
| 2018/0138035 | A1* | 5/2018 | Ohno ................ H01L 21/02057 |
| 2018/0358242 | A1* | 12/2018 | Kim .................... H01L 21/6719 |
| 2019/0103291 | A1* | 4/2019 | Inadomi ............ H01L 21/67745 |
| 2019/0295843 | A1* | 9/2019 | Yoo .................. H01L 21/67051 |

FOREIGN PATENT DOCUMENTS

| | | |
|---|---|---|
| JP | 4211271 B2 | 1/2009 |
| JP | 4382190 B2 | 12/2009 |
| JP | 4645781 B2 | 3/2011 |
| KR | 10-2011-0135898 A | 12/2011 |
| KR | 10-2013-0010826 A | 1/2013 |
| KR | 10-2015-0138975 A | 12/2015 |
| KR | 10-2016-0026302 A | 3/2016 |
| KR | 10-2018-0078881 A | 7/2016 |
| KR | 10-2016-0147162 A | 12/2016 |
| KR | 10-2018-0001690 A | 1/2018 |
| KR | 20180031849 A | 3/2018 |

OTHER PUBLICATIONS

Notice of References Cited for Priority U.S. Appl. No. 16/717,931 mailed on Jun. 24, 2021 (1 page).

* cited by examiner

METHOD FOR TREATING SUBSTRATE

CROSS-REFERENCE TO RELATED APPLICATIONS

This application is a Divisional of U.S. patent application Ser. No. 16/717,931, filed on Dec. 17, 2019, which claims priority under 35 U.S.C. § 119 to Korean Patent Application No. 10-2018-0163690 filed on Dec. 18, 2018, in the Korean Intellectual Property Office, the entire contents of which are hereby incorporated by reference.

BACKGROUND

Embodiments of the inventive concept described herein relate to an apparatus and method for treating a substrate such as a semiconductor wafer or a flat display panel.

To manufacture semiconductor elements or a flat panel display, a substrate treating apparatus performs liquid processing on a substrate, such as a semiconductor wafer or a glass substrate, with various types of processing liquids and thereafter performs a drying process of drying the substrate having the processing liquids adhering thereto. Here, the liquid processing by the processing liquids in the substrate treating apparatus includes a cleaning or etching process of cleaning or etching the surface of the substrate with a chemical, such as a cleaning solution or etchant, and a rinsing process of rinsing the surface of the substrate subjected to the cleaning process or the etching process with a rinsing solution.

A volatile organic chemical, such as isopropyl alcohol, is used in the drying process. The organic chemical may be supplied to the surface of the substrate to replace the rinsing solution, and thereafter the substrate may be dried. However, due to scaling-down of the critical dimension (CD) of a pattern formed on the surface of the substrate, the organic chemical supplied to the surface of the substrate fails to be removed even after the drying process is performed. Therefore, the organic chemical adhering to the surface of the substrate is solidified, and impurities, such as particles, may adhere to the solidified organic chemical.

SUMMARY

Embodiments of the inventive concept provide a substrate treating apparatus and method for efficiently treating a substrate.

Embodiments of the inventive concept provide a substrate treating apparatus and method for efficiently removing impurities remaining on a substrate subjected to a drying process.

Embodiments of the inventive concept provide a substrate treating apparatus and method for providing various factors to remove impurities remaining on a substrate subjected to a drying process.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes an index module, a cleaning process module that performs a cleaning process on the substrate, and a bake chamber that heats the substrate. The index module includes a load port on which a carrier having the substrate received therein is placed and a transfer frame disposed between the load port and the cleaning process module and including an index robot that transfers the substrate between the carrier placed on the load port and the cleaning process module. The cleaning process module includes a drying chamber that performs a drying process on the substrate having an organic solvent remaining on an upper surface thereof and a transfer chamber including a transfer robot that transfers the substrate in the cleaning process chamber. The bake chamber heats the substrate subjected to the drying process.

According to an embodiment, the cleaning process module may further include a liquid processing chamber that performs liquid processing on the substrate by supplying the organic solvent to the substrate.

According to an embodiment, the drying chamber may treat the substrate by supplying a supercritical fluid to the substrate.

According to an embodiment, the drying chamber may include a liquid supply unit that supplies the organic solvent to the substrate.

According to an embodiment, the bake chamber may include a housing having an interior space and a heating member that heats the substrate to thermally decompose an impurity adhering to the substrate.

According to an embodiment, the bake chamber may further include a controller that controls the heating member, and the controller may control the heating member to heat the substrate above a thermal decomposition temperature of the impurity adhering to the substrate.

According to an embodiment, the impurity may include carbon, and the controller may control the heating member to heat the substrate to a temperature of 600° C. or more.

According to an embodiment, the heating member may be a flash lamp that supplies light to the substrate to heat the substrate.

According to an embodiment, the bake chamber may further include a gas supply member that supplies an inert gas into the interior space and an exhaust line that discharges the inert gas.

According to an embodiment, the gas supply member and the exhaust line may be located in a higher position than the substrate located in the interior space.

According to an embodiment, the gas supply member may include a plurality of gas supply members attached to a sidewall of the housing, and the exhaust line may be located in an area facing the gas supply member.

According to an embodiment, the bake chamber may be provided on the index module.

According to an embodiment, the bake chamber may be provided to be detachable from the index module.

According to an embodiment, the index module and the cleaning process module may be arranged along a first direction, and the load port may include a plurality of load ports. The plurality of load ports may be arranged along a second direction perpendicular to the first direction. The bake chamber and the plurality of load ports may be arranged in a row along the second direction.

According to an embodiment, the bake chamber may be provided in the cleaning process module.

According to an embodiment, the bake chamber may be provided between the index module and the drying chamber.

According to an embodiment, the index module and the cleaning process module may be arranged along a first direction, and the index module, the drying chamber, and the bake chamber may be sequentially arranged along the first direction.

According to an embodiment, the apparatus may further include a controller that controls the apparatus, and the controller may control the transfer robot or the index robot such that the organic solvent supplied to the substrate is dried in the drying chamber and thereafter the substrate is heated in the bake chamber to thermally decompose an impurity adhering to the substrate.

According to an exemplary embodiment, an apparatus for treating a substrate includes a drying chamber that performs a drying process on the substrate having an organic solvent remaining on an upper surface thereof, a bake chamber that heats the substrate subjected to the drying process, and a transfer assembly that transfers the substrate between the drying chamber and the bake chamber.

According to an embodiment, the apparatus may further include a liquid processing chamber that performs liquid processing on the substrate by supplying the organic solvent to the substrate.

According to an embodiment, the drying chamber may treat the substrate by supplying a supercritical fluid to the substrate.

According to an embodiment, the apparatus may further include a heating member that heats the substrate to thermally decompose an impurity adhering to the substrate.

According to an embodiment, the bake chamber may include a housing having an interior space, a heating member that heats the substrate to thermally decompose an impurity adhering to the substrate, and a controller that controls the heating member. The controller may control the heating member to heat the substrate above a thermal decomposition temperature of the impurity adhering to the substrate.

According to an embodiment, the impurity may include carbon, and the controller may control the heating member to heat the substrate to a temperature of 600° C. or more.

According to an embodiment, the bake chamber may further include a gas supply member that supplies an inert gas into the interior space and an exhaust line that discharges the inert gas.

According to an embodiment, the gas supply member and the exhaust line may be located in a higher position than the substrate located in the interior space.

According to an embodiment, the gas supply member includes a plurality of gas supply members attached to a sidewall of the housing, and the exhaust line is located in an area facing the gas supply member.

According to an exemplary embodiment, a method for treating a substrate includes a solvent processing step of supplying an organic solvent onto the substrate to treat the substrate, a drying step of drying the substrate to remove the organic solvent on the substrate, and a bake step of heating the substrate to thermally decompose an impurity adhering to the substrate. The drying step and the bake step are performed in different chambers.

According to an embodiment, in the drying step, a supercritical fluid may be supplied onto the substrate to dry the substrate.

According to an embodiment, the bake step may be performed in a bake chamber including a heating member that heats the substrate, and the bake chamber may include a plurality of bake chambers. The plurality of bake chambers may include different heating members. A bake chamber with the heating member that is selected depending on the substrate, among the plurality of bake chambers, may be mounted in a substrate treating apparatus in which a drying chamber that performs the drying step is installed, and the bake step may be performed in the selected bake chamber.

According to an embodiment, the heating member of the bake chamber may be a selected one of a flash lamp, an infrared lamp, an ultraviolet lamp, a laser, and a heating wire.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 1 to 9.

Figure 1:
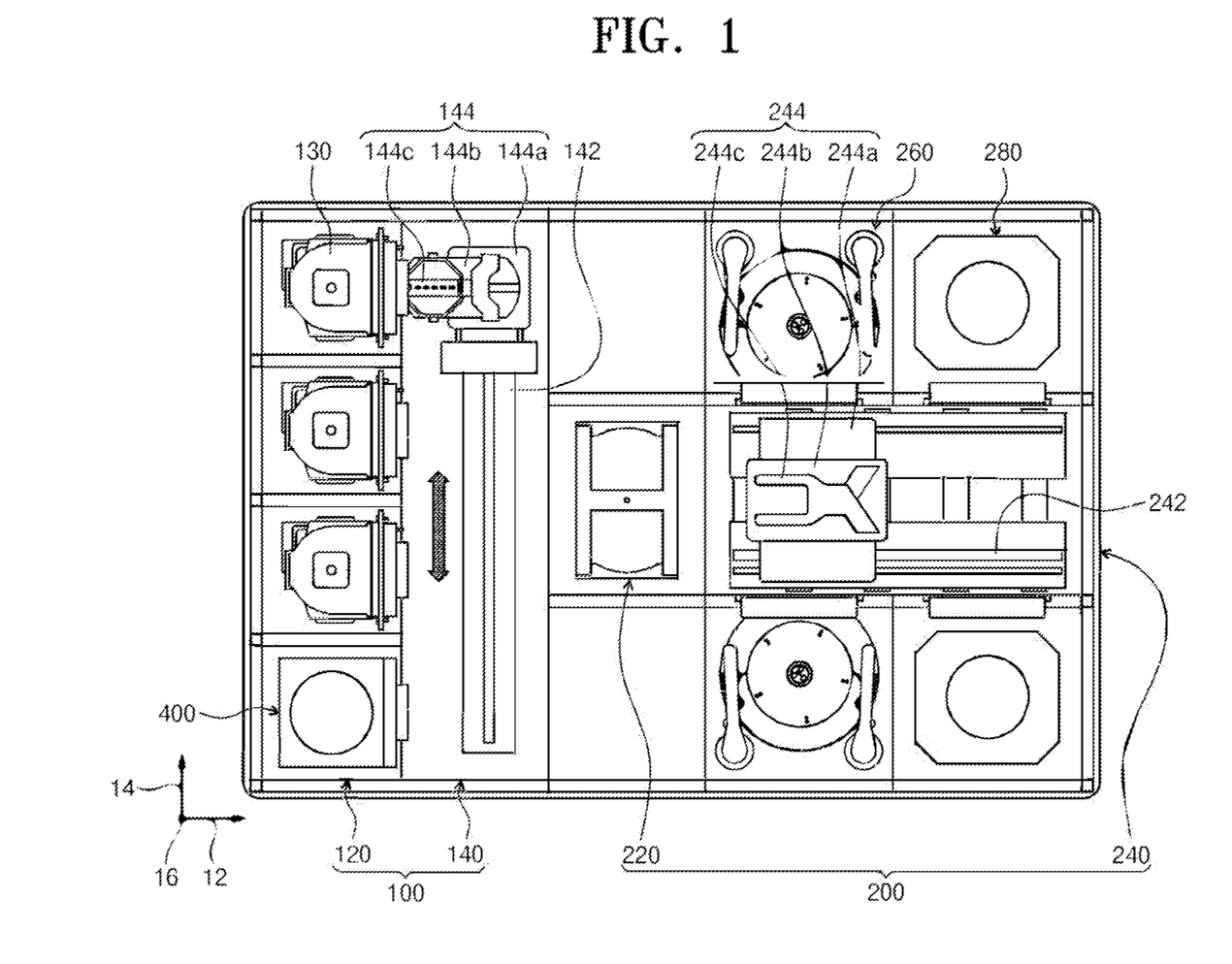
FIG. 1 is a plan view illustrating a substrate treating apparatus according to an embodiment of the inventive concept.

FIG. 1 is a plan view illustrating a substrate treating apparatus according to an embodiment of the inventive concept. Referring to FIG. 1, the substrate treating apparatus 10 includes an index module 100 and a cleaning process module 200. The index module 100 includes load ports 120 and a transfer frame 140. The load ports 120, the transfer frame 140, and the cleaning process module 200 are sequentially arranged in a row. Hereinafter, the direction in which the load ports 120, the transfer frame 140, and the cleaning process module 200 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 130 having substrates W received therein are placed on the load ports 120. The load ports 120 are arranged in a row along the second direction 14. The number of load ports 120 may be increased or decreased depending on the process efficiency and footprint condition of the cleaning process module 200. Each of the carriers 130 includes a plurality of slots (not illustrated) for receiving the substrates W in a horizontal position relative to the ground. A front opening unified pod (FOUP) may be used as the carrier 130.

The cleaning process module 200 includes a buffer unit 220, a transfer chamber 240, liquid processing chambers 260, and drying chambers 280. The transfer chamber 240 is arranged such that the lengthwise direction thereof is parallel to the first direction 12. The liquid processing chambers 260 or the drying chambers 280 are disposed on opposite sides of the transfer chamber 240. The liquid processing chambers 260 or the drying chambers 280 are located on one side and an opposite side of the transfer chamber 240 in a symmetric arrangement with respect to the transfer chamber 240.

A plurality of liquid processing chambers 260 and drying chambers 280 are provided on the one side of the transfer chamber 240. The liquid processing chambers 260 and the drying chambers 280 may be sequentially arranged along the lengthwise direction of the transfer chamber 240. Furthermore, the liquid processing chambers 260 may be stacked one above another. In addition, the drying chambers 280 may also be stacked one above another in the same way. That is, the liquid processing chambers 260 and the drying chambers 280 may be arranged in an A×B array on the one side of the transfer chamber 240. Here, "A" denotes the number of liquid processing chambers 260 and drying chambers 280 arranged in a row along the first direction 12, and "B" denotes the number of liquid processing chambers 260 or drying chambers 280 arranged in a column along the third direction 16. In the case where three liquid processing chambers 260 and three drying chambers 280 are provided on the one side of the transfer chamber 240, the liquid processing chambers 260 and the drying chambers 280 may be arranged in a 2×3 array. The number of liquid processing chambers 260 and the number of drying chambers 280 may be increased or decreased. Alternatively, the liquid processing chambers 260 and the drying chambers 280 may be provided on only the one side of the transfer chamber 240. In another case, the liquid processing chambers 260 and the drying chambers 280 may be provided in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 includes slots (not illustrated) in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 is disposed between the load ports 120 and the cleaning process module 200. The transfer frame 140 may transfer the substrates W between the carriers 130 placed on the load ports 120 and the cleaning process module 200. For example, the transfer frame 140 may transfer the substrates W between the carriers 130 placed on the load ports 120 and the buffer unit 220.

An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and index arms 144c. The base 144a is installed to be movable along the index rail 142. The body 144b is combined with the base 144a. The body 144b is movable on the base 144a along the third direction 16. Furthermore, the body 144b is rotatable on the base 144a. The index arms 144c are coupled to the body 144b and are movable forward and backward relative to the body 144b. The index arms 144c may individually operate. The index arms 144c are stacked one above another with a spacing gap therebetween along the third direction 16. Some of the index arms 144c may be used to transfer the substrates W from the cleaning process module 200 to the carriers 130, and the other index arms 144c may be used to transfer the substrates W from the carriers 130 to the cleaning process module 200. Accordingly, particles generated from the substrates W that are to be treated may be prevented from adhering to the treated substrates W in the process in which the index robot 144 transfers the substrates W between the carriers 130 and the cleaning process module 200.

The transfer chamber 240 transfers the substrates W between the buffer unit 220, the liquid processing chambers 260, and the drying chambers 280. A guide rail 242 and a transfer robot 244 are provided in the transfer chamber 240. The guide rail 242 is arranged such that the lengthwise direction thereof is parallel to the first direction 12. The transfer robot 244 is installed on the guide rail 242 and rectilinearly moves on the guide rail 242 along the first direction 12. The transfer robot 244 includes a base 244a, a body 244b, and main arms 244c. The base 244a is installed to be movable along the guide rail 242. The body 244b is combined with the base 244a. The body 244b is movable on the base 244a along the third direction 16. Furthermore, the body 244b is rotatable on the base 244a. The main arms 244c are coupled to the body 244b and are movable forward and backward relative to the body 244b. The main arms 244c may individually operate. The main arms 244c are stacked one above another with a spacing gap therebetween along the third direction 16.

Each of the liquid processing chambers 260 performs a process of treating a substrate with liquids. For example, the liquid processing chamber 260 may perform a cleaning process. For example, the liquid processing chamber 260 may perform the cleaning process by supplying chemicals, such as hydrofluoric acid, sulfuric acid, phosphoric acid, or the like, to the substrate. Furthermore, the liquid processing chamber 260 may perform a rising process by supplying a rising solution, such as deionized water, to the substrate. In addition, the liquid processing chamber 260 may perform liquid processing on the substrate by supplying an organic solvent, such as isopropyl alcohol (hereinafter, referred to as IPA), to the substrate. The cleaning process, the rinsing process, and the process using the organic solvent may be sequentially performed. The rinsing solution remaining on the substrate may be replaced by the organic solvent supplied to the substrate. Also, the liquid processing chamber 260 may perform a spin drying process on the substrate by rotating the substrate having the IPA supplied thereto.

Each of the drying chambers 280 performs a drying process on the substrate. The drying chamber 280 may be a high-pressure chamber maintained at high temperature and high pressure. The drying chamber 280 may treat the substrate by supplying a supercritical fluid to the substrate. For example, the substrate subjected to the liquid processing in the liquid processing chamber 260 may be transferred into the drying chamber 280, with the organic solvent remaining on the substrate. Thereafter, the drying chamber 280 may perform a drying process on the substrate by supplying a supercritical fluid to the substrate. The supercritical fluid may be carbon dioxide.

Although it has been exemplified that the substrate is dried by using the supercritical fluid, the substrate may be dried by being rotated at high speed. While the substrate is rotated, an inert gas, such as nitrogen, may be supplied to the substrate. The inert gas may be supplied to the substrate in a state of being heated.

Figure 3:
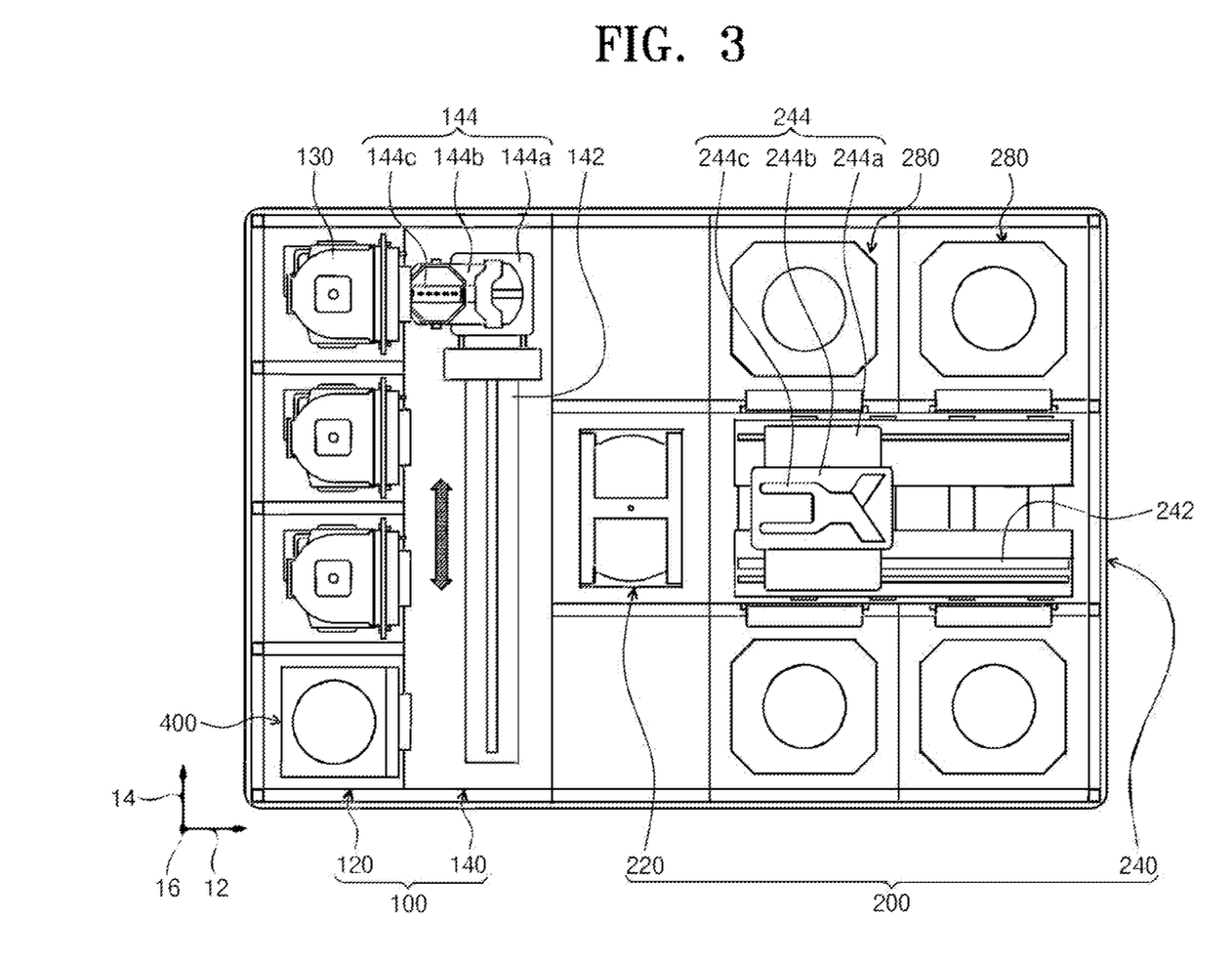
FIG. 3 is a plan view illustrating a substrate treating apparatus according to another embodiment of the inventive concept.

Although it has been exemplified that the organic solvent is supplied to the substrate in the liquid processing chamber 260 and the substrate having the organic solvent remaining thereon is transferred into the drying chamber 280, the inventive concept is not limited thereto. For example, as illustrated in FIG. 3, the liquid processing chamber 260 may not be provided, and liquid processing may be performed in the drying chamber 280. In this case, the drying chamber 280 may include a liquid supply unit for supplying an organic solvent to the substrate. Accordingly, the liquid supply unit of the drying chamber 280 may supply the organic solvent to the substrate, and thereafter the substrate may be dried by being rotated.

A bake chamber 400 may heat the substrate. The bake chamber 400 may thermally decompose impurities adhering to the substrate, by heating the substrate. The substrate heated in the bake chamber 400 may be a substrate subjected to liquid processing and drying.

Figure 2:
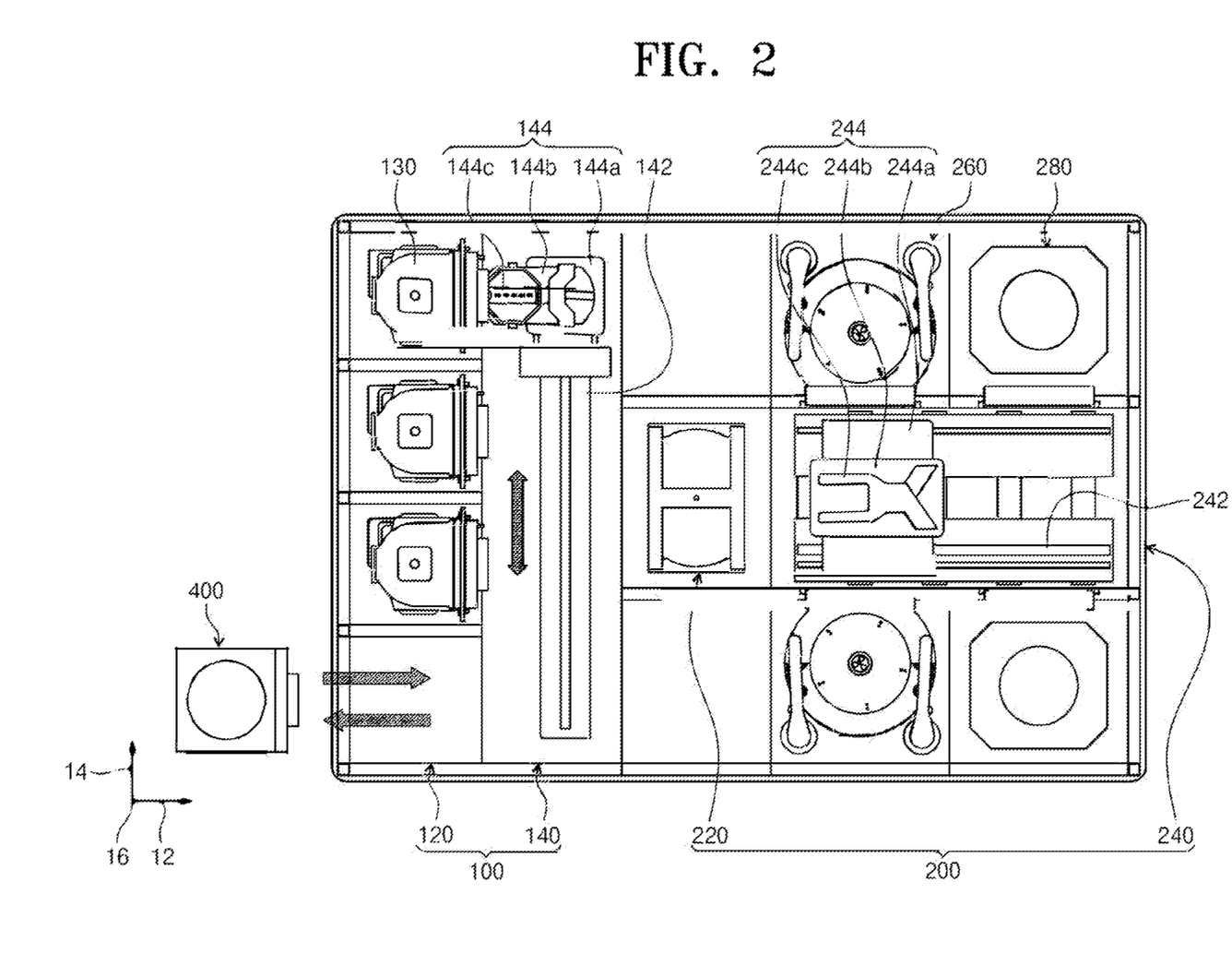
FIG. 2 is a plan view illustrating a substrate treating apparatus according to another embodiment of the inventive concept.

The bake chamber 400 may be provided on the index module 100. For example, the bake chamber 400 and the load ports 120 may be arranged in a row along the second direction 14. Furthermore, as illustrated in FIG. 2, the bake chamber 400 may be provided to be detachable from the index module 100.

A controller 490 may control the substrate treating apparatus 10. The controller 490 may control the substrate treating apparatus 10 to perform a substrate treating method that will be described below. For example, the controller 490 may control a transfer assembly such that the organic solvent supplied onto the substrate is dried in the drying chamber 280 and the substrate is heated in the bake chamber 400 for thermal decomposition of the impurities adhering to the substrate. Here, the transfer assembly may be defined as referring to all components for transferring the substrate. For example, the term "transfer assembly" as used herein is a concept including the index robot 144 and the transfer robot 244.

Figure 4:
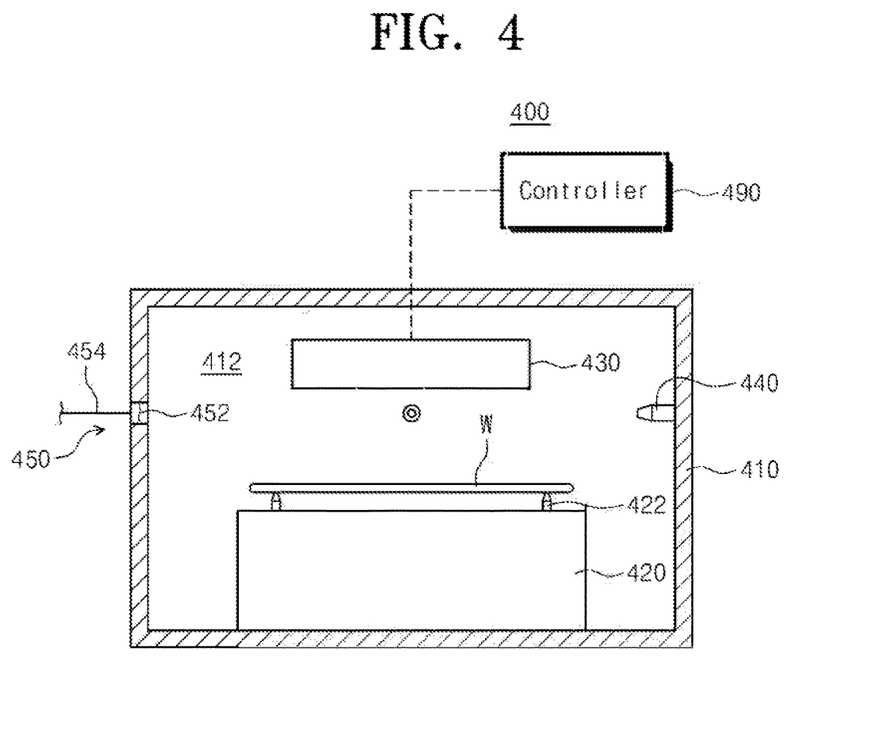
FIG. 4 is a sectional view illustrating one embodiment of a bake chamber of FIG. 1.

FIG. 4 is a sectional view illustrating one embodiment of the bake chamber of FIG. 1. Referring to FIG. 4, the bake chamber 400 may include a housing 410, a support plate 420, a heating member 430, a gas supply member 440, and an exhaust member 450.

The housing 410 has an interior space 412 in which a substrate W is treated. The housing 410 has a substantially rectangular parallelepiped shape. The housing 410 has, in a sidewall thereof, an entrance (not illustrated) through which the substrate W is loaded into or unloaded from the housing 410. The entrance may remain open. Alternatively, a door (not illustrated) for opening or closing the entrance may be provided. The door (not illustrated) may prevent an external air flow from being introduced into the bake chamber 400, or may prevent heat from being released to the outside, while the substrate W is heated in the bake chamber 400.

The support plate 420 may support the substrate W in the interior space 412. Support pins 422 may be provided on the support plate 420. The support pins 422 may support the substrate W. The support pins 422 may be raised to load the substrate W onto the support plate 420 or unload the substrate W from the support plate 420.

The heating member 430 may heat the substrate W. For example, the heating member 430 may heat a substrate W subjected to a drying process in the liquid processing chamber 260 and/or the drying chamber 280. The heating member 430 may heat the substrate W to thermally decompose impurities P adhering to the substrate W. The heating member 430 may be a non-contact type heating unit. For example, the heating member 430 may be implemented with a flash lamp. The flash lamp may supply light to the substrate W to heat the substrate W. The temperature of the substrate W may be rapidly raised due to the straightness of light supplied by the flash lamp.

Although it has been exemplified that the heating member 430 is a flash lamp, the heating member 430 is not limited thereto. For example, the heating member 430 may be an infrared (IR) lamp, an ultraviolet (UV) lamp, or a laser that is a non-contact type heating unit. The IR lamp may supply IR light having a longer wavelength than visible light to the substrate W to heat the substrate W. The UV lamp may supply UV light having a shorter wavelength than visible light to the substrate W to heat the substrate W. The laser may apply a laser beam to the substrate W to heat the substrate W.

The gas supply member 440 may supply gas into the interior space 412. The gas supplied into the interior space 412 by the gas supply member 440 may be an inert gas. For example, the inert gas may be nitrogen gas. The inert gas supplied into the interior space 412 by the gas supply member 440 may function as a carrier gas that delivers the thermally-decomposed impurities P to the exhaust member 450. A plurality of gas supply members 440 may be attached to the sidewall of the housing 410. Furthermore, the gas supply members 440 may be located in a higher position than the substrate W located in the interior space 412.

The exhaust member 450 may discharge the inert gas supplied into the interior space 412 and the thermally-decomposed impurities P out of the bake chamber 400. The exhaust member 450 may include an exhaust hole 452 and an exhaust line 454. The exhaust hole 452 may be formed in the sidewall of the housing 410, and the exhaust line 454 may be connected to the exhaust hole 452. The exhaust hole 452 and the exhaust line 454 may be located in a higher position than the substrate W located in the interior space 412. Furthermore, the exhaust member 450 may be located in an area facing the gas supply member 440 described above. Moreover, the exhaust line 454 may be connected with a pressure reducing member (not illustrated) that reduces the pressure in the interior space 412. The pressure reducing member (not illustrated) may be implemented with a pump. However, the pressure reducing member (not illustrated) is not limited thereto, and a well-know device capable of reducing the pressure in the interior space 412 may be used as the pressure reducing member (not illustrated).

The heating member 430 is connected with the controller 490. The controller 490 may control the temperature of the substrate W that the heating member 430 heats.

Figure 5:
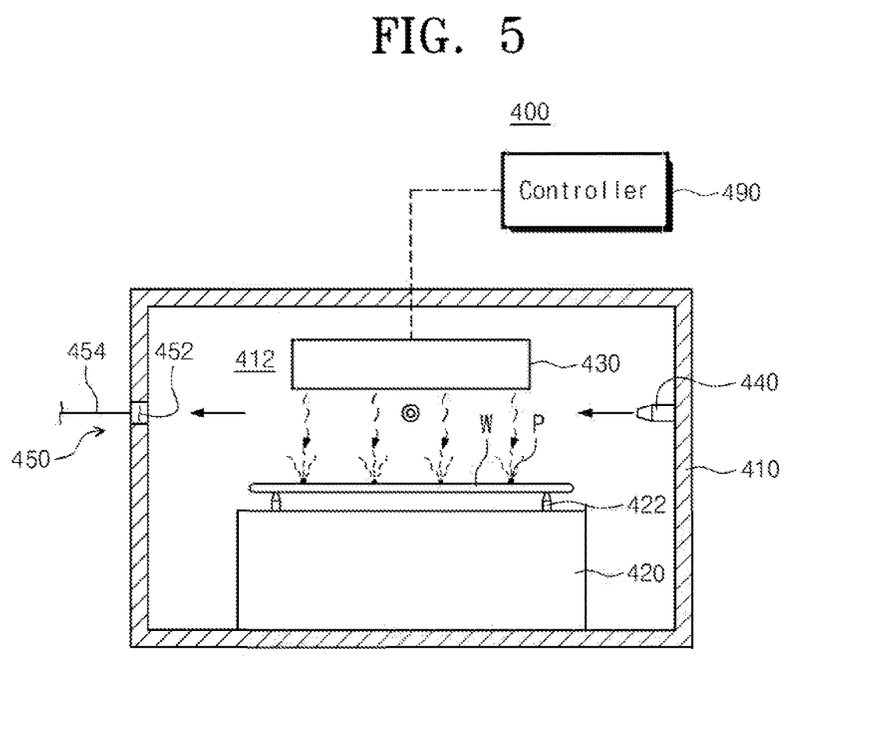
FIG. 5 is a view illustrating a state of removing impurities adhering to a substrate in the bake chamber of FIG. 4.

FIG. 5 is a view illustrating a state of removing impurities adhering to a substrate in the bake chamber of FIG. 4. Referring to FIG. 5, a substrate W subjected to a drying process in the liquid processing chamber 260 and/or the drying chamber 280 is transferred into the bake chamber 400. The substrate W transferred into the bake chamber 400 is placed on the support plate 420. After the substrate W is placed on the support plate 420, the heating member 430 may supply light to the substrate W to heat the substrate W. Accordingly, heat is transferred to impurities P adhering to the substrate W. The impurities P adhering to the substrate W may be thermally decomposed by the heat. The controller 490 may allow the substrate W to be heated above the thermal decomposition temperature of the impurities P adhering to the substrate W. For example, in the case where the impurities P contain carbon, the controller 490 may control the heating member 430 to heat the substrate W to a temperature of 600° C. or more.

When the impurities P adhering to the substrate W are thermally decomposed and evaporated, the thermally-decomposed impurities P may be delivered to the exhaust hole 452 by an inert gas supplied by the gas supply member 440. The inert gas and the thermally-decomposed impurities P delivered to the exhaust hole 452 may be discharged outside the bake chamber 400 through the exhaust line 454.

Figure 6:
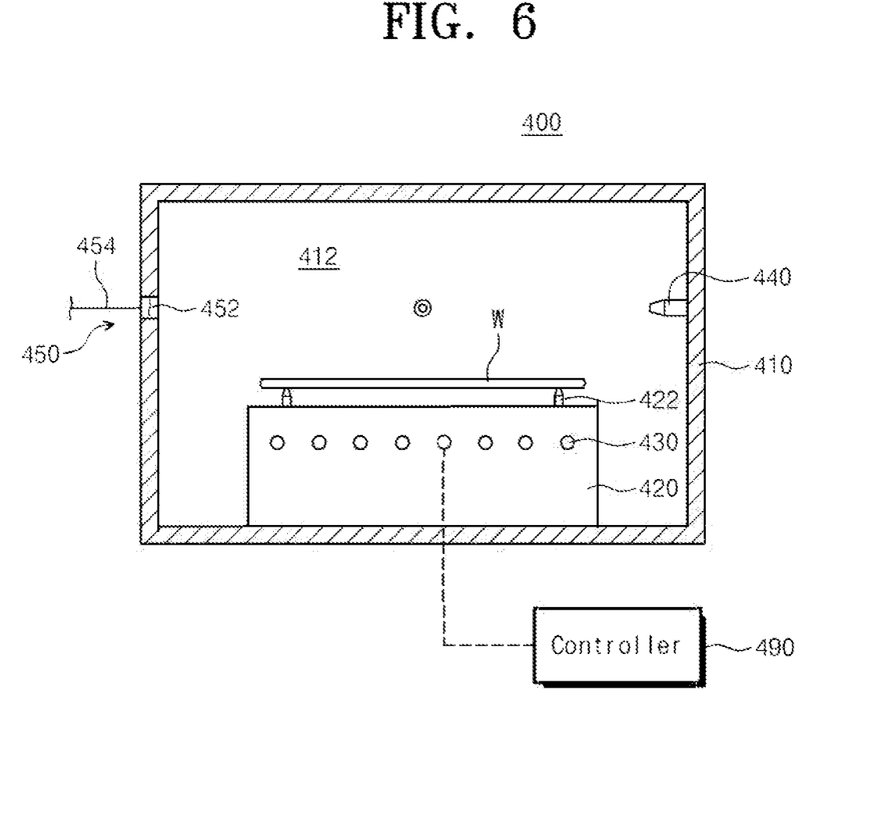
FIG. 6 is a sectional view illustrating another embodiment of the bake chamber of FIG. 1.

Although it has been exemplified that the heating member 430 for heating the substrate W is a non-contact type heating unit, the heating member 430 may be a contact type heating unit. For example, as illustrated in FIG. 6, the heating member 430 may be implemented as a heating wire located in the support plate 420. The heating member 430 that is implemented as the heating wire may be connected with the controller 490. The function and effect of the heating member 430 implemented with a contact type heating unit may be the same as, or similar to, those when the heating member 430 is implemented with a non-contact type heating unit, and therefore detailed descriptions thereabout will be omitted.

Figure 7:
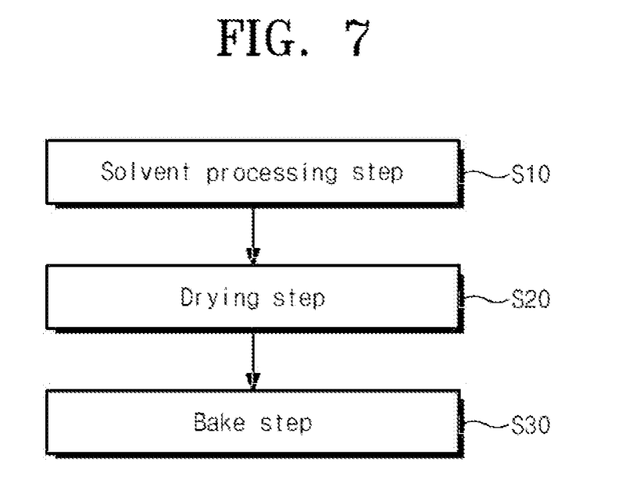
FIG. 7 is a flowchart illustrating a substrate treating method according to an embodiment of the inventive concept.

FIG. 7 is a flowchart illustrating a substrate treating method according to an embodiment of the inventive concept. Referring to FIG. 7, the substrate treating method may include solvent processing step S10, drying step S20, and bake step S30.

Solvent processing step S10 is a step of supplying an organic solvent onto a substrate W to treat the substrate W. For example, solvent processing step S10 may be a step of supplying the organic solvent to deionized water remaining on the substrate W and replacing the deionized water remaining on the substrate W with the organic solvent. Solvent processing step S10 may be performed in the liquid processing chamber 260.

Drying step S20 is a step of drying the substrate W to remove the organic solvent on the substrate W. Drying step S20 may be performed after solvent processing step S10. Furthermore, drying step S20 may be a step of drying the substrate W by supplying a supercritical fluid onto the substrate W having the organic solvent remaining thereon. Drying step S20 may be performed in the drying chamber 280. Specifically, in drying step S20, the substrate W may be transferred into the drying chamber 280 in the state in which the organic solvent supplied onto the substrate W in the liquid processing chamber 260 remains on the substrate W, and thereafter the supercritical fluid may be supplied onto the substrate W in the drying chamber 280 to dry the substrate W.

Bake step S30 is a step of heating the substrate W to thermally decompose impurities adhering to the substrate W. Bake step S30 may be performed after drying step S20. Bake step S30 may be performed in a chamber different from the chambers in which solvent processing step S10 and drying step S20 are performed. For example, solvent processing step S10 may be performed in the liquid processing chamber 260, drying step S20 may be performed in the drying chamber 280, and bake step S30 may be performed in the bake chamber 400.

Although it has been exemplified that solvent processing step S10 is performed in the liquid processing chamber 260 and drying step S20 is performed in the drying chamber 280, the inventive concept is not limited thereto.

For example, both solvent processing step S10 and drying step S20 may be performed in the drying chamber 280. Specifically, the drying chamber 280 may have a liquid supply unit for supplying an organic solvent to the substrate W. The liquid supply unit of the drying chamber 280 may perform solvent processing step S10 by supplying the organic solvent to the substrate W. Thereafter, drying step S20 of drying the substrate W may be performed in the drying chamber 280.

Figure 8:
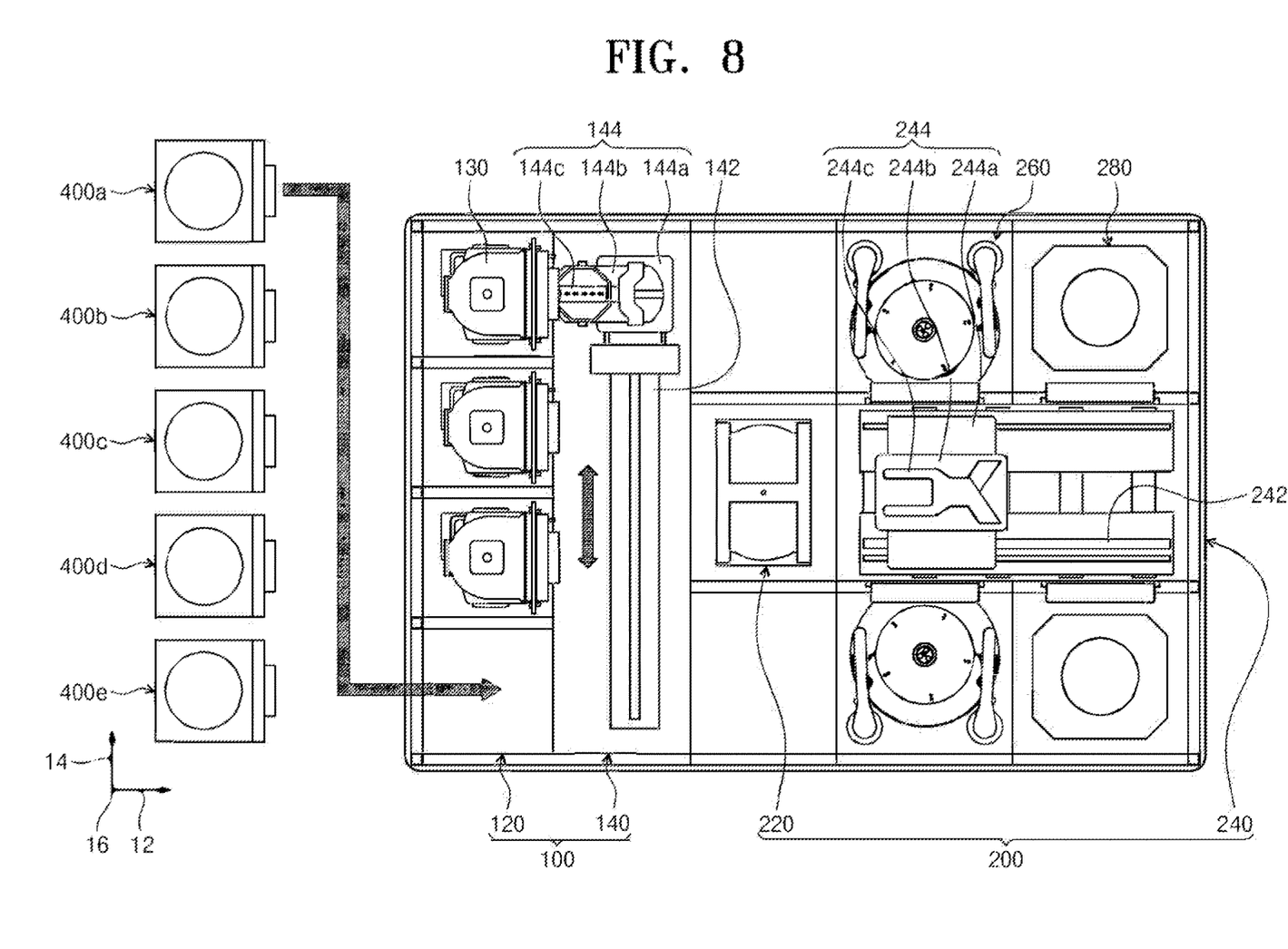
FIG. 8 is a view illustrating a substrate treating method according to another embodiment of the inventive concept.

FIG. 8 is a view illustrating a substrate treating method according to another embodiment of the inventive concept. Referring to FIG. 8, a plurality of bake chambers 400 may be provided. For example, a plurality of bake chambers 400a, 400b, 400c, 400d, and 400e may have different heating members 430. For example, the heating member 430 of the first bake chamber 400a may be a flash lamp. The heating member 430 of the second bake chamber 400b may be an IR lamp. The heating member 430 of the third bake chamber 400c may be a UV lamp. The heating member 430 of the fourth bake chamber 400d may be a laser. The heating member 430 of the fifth bake chamber 400e may be a flash lamp.

In the substrate treating method, a bake chamber with the heating member 430 that is selected depending on a substrate, among the plurality of bake chambers 400a, 400b, 400c, 400d, and 400e, may be mounted in the substrate treating apparatus 10 in which the drying chamber 280 is installed. Mounting the bake chamber selected depending on the substrate in the substrate treating apparatus 10 may vary depending on the type of organic solvent supplied to the substrate or the type of substrate to be treated. The bake chamber 400 mounted in the substrate treating apparatus 10 may perform bake step S30 described above.

An apparatus in the related art treats a substrate by supplying an organic solvent to the substrate and thereafter performs a process of drying the substrate. However, the apparatus in the related art has a problem in that the organic solvent supplied to the substrate is not appropriately removed due to scaling-down of the critical dimension of a pattern formed on the surface of the substrate. The organic solvent is solidified in the process of transferring the substrate, and particles adhere to the solidified organic solvent to deteriorate efficiency in treating the substrate. However, according to an embodiment of the inventive concept, an organic solvent is supplied to a substrate, and thereafter the substrate subjected to the drying process is heated. Accordingly, impurities adhering to the substrate after the drying process is performed are thermally decomposed and removed.

In the case where a heating unit for heating a substrate is installed in the liquid processing chamber 260 that performs solvent processing step S10, an organic solvent may not be appropriately supplied to a substrate W. For example, when the organic solvent is heated, the organic solvent is less likely to be supplied in a liquid phase to the substrate. Moreover, in the case where a heating unit for heating a substrate is installed in the drying chamber 280 that performs drying step S20, the structure of the drying chamber 280 is complicated. However, according to an embodiment of the inventive concept, chambers for performing solvent processing step S10 and drying step S20 and a chamber for performing bake step S30 differ from each other. Accordingly, the aforementioned problems occurring when the heating unit is installed in the liquid processing chamber 260 or the drying chamber 280 are able to be solved.

Impurities, such as particles, are likely to adhere to a substrate in a process in which the substrate is transferred after solvent processing step S10 and drying step S20 are performed. However, according to an embodiment of the inventive concept, the bake chamber 400 is provided on the index module 100. In the bake chamber 400 provided on the index module 100, bake step S30 is performed on a substrate subjected to solvent processing step S10 and drying step S20. The substrate subjected to bake step S30 may be immediately transferred outside the substrate treating apparatus 10 without a process of separately transferring the substrate in the substrate treating apparatus 10. Accordingly, it is possible to minimize a risk that particles adhere to the substrate, which is subjected to bake step S30, in a process in which the substrate is transferred so as to be unloaded outside the substrate treating apparatus 10.

According to an embodiment of the inventive concept, the bake chamber 400 includes the plurality of bake chambers 400a, 400b, 400c, 400d, and 400e, and the bake chambers 400a, 400b, 400c, 400d, and 400e have the different heating members 430. Furthermore, as described above, the bake chambers 400a, 400b, 400c, 400d, and 400e are detachable from the substrate treating apparatus 10. Depending on a substrate to be treated in the substrate treating apparatus 10, a bake chamber 400 selected from the plurality of bake chambers 400a, 400b, 400c, 400d, and 400e may be mounted in the substrate treating apparatus 10. Accordingly, bake step S30 may be performed with various factors.

Although it has been exemplified that the bake chamber 400 is provided on the index module 100, the inventive concept is not limited thereto. For example, the bake chamber 400 may be provided in the cleaning process module 200. In the case where the bake chamber 400 is provided in the cleaning process module 200, the plurality of bake chambers 400a, 400b, 400c, 400d, and 400e may be stacked one above another.

Figure 9:
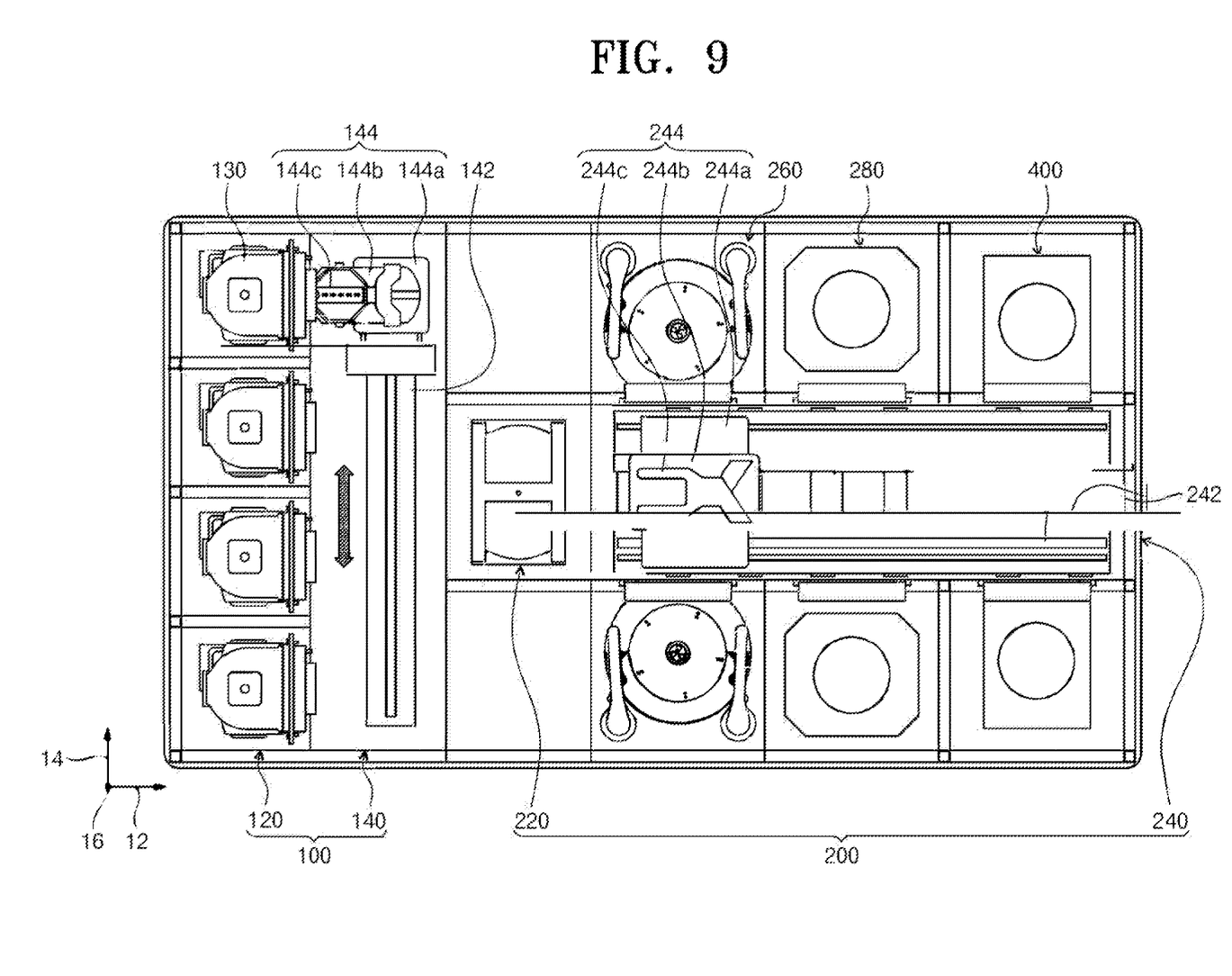
FIG. 9 is a plan view illustrating a substrate treating apparatus according to another embodiment of the inventive concept.

For example, as illustrated in FIG. 9, the index module 100 and the cleaning process module 200 may be arranged along the first direction 12 when viewed from above, and the index module 100, the drying chambers 280, and the bake chambers 400 may be sequentially arranged along the first direction 12. Furthermore, the bake chamber 400 may include a plurality of bake chambers stacked one above another along the third direction 16.

Figure 10:
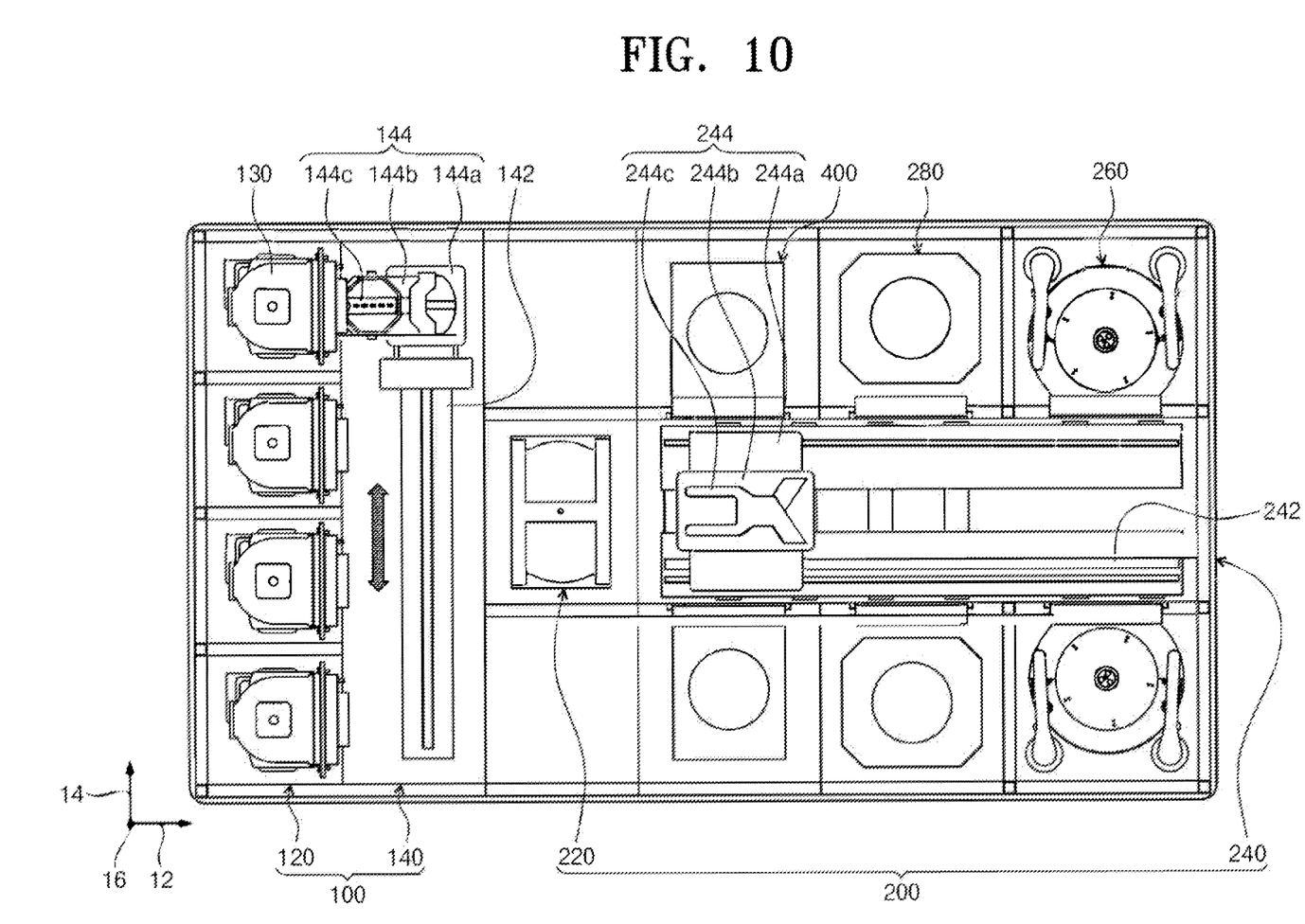
FIG. 10 is a plan view illustrating a substrate treating apparatus according to another embodiment of the inventive concept.

Moreover, as illustrated in FIG. 10, the bake chamber 400 may be provided in the cleaning process module 200 and may be located between the index module 100 and the drying chambers 280 when viewed from above. Even in this case, the bake chamber 400 may include a plurality of bake chambers stacked one above another along the third direction 16. Also, in the embodiments illustrated in FIGS. 9 and 10, the bake chamber 400 may be detachable from the substrate treating apparatus 10.

According to the embodiments of the inventive concept, the substrate treating apparatus and method may efficiently treat a substrate.

Furthermore, the substrate treating apparatus and method may efficiently remove impurities remaining on a substrate subjected to a drying process.

Moreover, the substrate treating apparatus and method may minimize re-adhesion of impurities to a substrate subjected to a cleaning process and a drying process.

In addition, the substrate treating apparatus and method may use various factors to remove impurities remaining on a substrate subjected to a drying process, thereby efficiently performing the removal of impurities.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A method for treating a substrate, the method comprising:
providing a substrate treating apparatus comprising a processing chamber, a drying chamber, and a buffer unit, and providing a plurality of bake chambers located outside of the substrate treating apparatus;
selecting a bake chamber of the plurality of bake chambers;
transferring the selected bake chamber from the outside of the substrate treating apparatus to inside of the sub- strate treating apparatus to position the selected bake chamber at an outermost edge of the substrate treating apparatus;

supplying an organic solvent onto the substrate, in the processing chamber, to treat the substrate;

drying the substrate, in the drying chamber, to remove the organic solvent on the substrate;

transferring the substrate from the drying chamber to the buffer unit;

transferring the substrate from the buffer unit to the selected bake chamber; and baking the substrate, in the selected bake chamber, to thermally decompose an impurity of the organic solvent adhering to the substrate, wherein the drying chamber, the processing chamber, the buffer unit, and the selected bake chamber are sequentially arranged between opposing sides of the substrate treating apparatus, such that the processing chamber is located adjacent to the drying chamber and the buffer unit, wherein the plurality of bake chambers include different heaters, wherein the selected bake chamber is removably mounted in the substrate treating apparatus, and wherein the heaters of the plurality of bake chambers are selected from a group consisting of a flash lamp, an infrared lamp, an ultraviolet lamp, a laser, and a heating wire.

2. The method of claim 1, wherein in the drying, a supercritical fluid is supplied onto the substrate to dry the substrate.

3. The method of claim 1, wherein, in the baking of the substrate, an inert gas is supplied into a housing of the selected bake chamber.

4. The method of claim 3, wherein the inert gas is supplied by a gas supply member attached to one sidewall of the housing.

5. The method of claim 4, wherein the inert gas is exhausted by an exhaust line attached to an other sidewall of the housing and located in an area facing the gas supply member.

6. The method of claim 5, wherein the inert gas is supplied to a position higher than a position of the substrate.

7. The method of claim 1, wherein the impurity includes carbon.

8. The method of claim 7, wherein, in the baking of the substrate, the substrate is heated to a temperature of 600° C. or more.

9. The method of claim 1, wherein, in the drying of the substrate, a fluid is supplied to the substrate to remove the organic solvent on the substrate.

10. The method of claim 9, wherein the fluid is carbon dioxide.

11. The method of claim 10, wherein the organic solvent is isopropyl alcohol.

* * * * *